(12) United States Patent
Wang

(10) Patent No.: US 9,515,078 B2
(45) Date of Patent: Dec. 6, 2016

(54) SEMICONDUCTOR STRUCTURE AND METHOD FOR FORMING THE SAME

(71) Applicants: Semiconductor Manufacturing International (Beijing) Corporation, Beijing (CN); Semiconductor Manufacturing International (Shanghai) Corporation, Shanghai (CN)

(72) Inventor: Xinpeng Wang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 205 days.

(21) Appl. No.: 14/266,693

(22) Filed: Apr. 30, 2014

(65) Prior Publication Data
US 2015/0035038 A1 Feb. 5, 2015

(30) Foreign Application Priority Data
Aug. 5, 2013 (CN) .......................... 2013 1 0337245

(51) Int. Cl.
| H01L 29/788 | (2006.01) |
|---|---|
| H01L 29/49 | (2006.01) |
| H01L 27/115 | (2006.01) |
| H01L 29/66 | (2006.01) |

(52) U.S. Cl.
CPC ... *H01L 27/11521* (2013.01); *H01L 29/66825* (2013.01)

(58) Field of Classification Search
CPC ................... H01L 21/76224; H01L 21/76232; H01L 29/66825; H01L 21/28273; H01L 29/42324; H01L 27/11517; H01L 27/11521
See application file for complete search history.

(56) References Cited

U.S. PATENT DOCUMENTS

2006/0244095 A1* 11/2006 Barry ................ H01L 21/76232
257/510

* cited by examiner

*Primary Examiner* — Matthew Landau
*Assistant Examiner* — Scott Stowe
(74) *Attorney, Agent, or Firm* — Anova Law Group, PLLC

(57) ABSTRACT

Various embodiments provide semiconductor structures and methods for forming the same. In an exemplary method, a semiconductor substrate is provided. A first stop layer, a first sacrificial layer, a second stop layer, and a second sacrificial layer are formed sequentially on the semiconductor substrate. The second sacrificial layer, the second stop layer, the first sacrificial layer, the first stop layer, and the semiconductor substrate are etched to form a groove, the groove then being filled to form an isolation structure. The second sacrificial layer is removed to expose sidewalls and a top of an exposed portion of the isolation structure. The second stop layer is removed, and the exposed portion of the isolation structure is etched to reduce a width of the top of the exposed portion of the isolation structure. The first sacrificial layer is removed. A floating gate is formed on the first stop layer.

20 Claims, 6 Drawing Sheets

US 9,515,078 B2

SEMICONDUCTOR STRUCTURE AND METHOD FOR FORMING THE SAME

CROSS-REFERENCES TO RELATED APPLICATIONS

This application claims priority to Chinese Patent Application No. CN201310337245.9, filed on Aug. 5, 2013, the entire contents of which are incorporated herein by reference.

FIELD OF THE DISCLOSURE

The present disclosure relates to the field of semiconductor technology and, more particularly, relates to semiconductor structures and methods for forming the same.

BACKGROUND

In current semiconductor industry, integrated circuit (IC) products are divided into three main types including logic, memory, and analog circuit. Memory devices account for a significant portion of IC products. Memory devices include, e.g., random access memory (RAM), dynamic random access memory (DRAM), read-only memory (ROM), erasable programmable read-only memory (EPROM), flash memory (FLASH) and ferroelectric RAM (FRAM), etc. Flash memory devices have had especially rapid development. Main features of flash memory devices include a number of advantages such as ability of long-term information storage without electric power, high degree of integration, fast access speed, and ease of erasing. Thus, flash memory devices are widely applied in many areas such as microcomputers, and automated control. Flash memory structure generally includes a floating gate and a control gate.

FIGS. 1-4 depict cross-sectional views of a floating gate structure of a conventional flash memory device at various stages during its formation. Referring to FIG. 1, a semiconductor substrate 10 is provided. An oxide layer 20 on the surface of the semiconductor substrate 10, and a silicon nitride layer 30 on the surface of the oxide layer 20, are sequentially formed. An opening is formed in the oxide layer 20 and the silicon nitride layer 30. The semiconductor substrate 10 is etched along the opening to form a groove. The groove is filled with silicon oxide to form an isolation structure 40. The surface of the isolation structure 40 is leveled with the surface of the silicon nitride layer 30.

Referring to FIG. 2, the silicon nitride layer 30 (in FIG. 1) is removed, to expose a portion of the isolation structure 40 located above the oxide layer 20. Referring to FIG. 3, a polysilicon layer 50 is formed on the surface of the oxide layer 20 and the isolation structure 40. The polysilicon layer 50 fills a gap between adjacent isolation structures 40.

Refer to FIG. 4, the polysilicon layer 50 is planarized to form a polysilicon layer 51 after the planarization. The surface of polysilicon layer 51 (i.e., the polysilicon layer 50 after the planarization) is leveled with the surface of the isolation structure 40. The polysilicon layer 51 and the oxide layer 20 beneath the polysilicon layer 51 thus form a floating gate structure.

However, under currently used processes, the polysilicon layer of the conventional floating gate structure tends to have voids. Performance of a subsequently-formed flash memory device can thus be affected. The disclosed methods and structures are directed to solve one or more problems set forth above and other problems.

BRIEF SUMMARY OF THE DISCLOSURE

One aspect of the present disclosure includes a method for forming a semiconductor structure. In an exemplary method, a semiconductor substrate can be provided. A first stop layer on the semiconductor substrate, a first sacrificial layer on the first stop layer, a second stop layer on the first sacrificial layer, and a second sacrificial layer on the second stop layer, can be formed sequentially. The second sacrificial layer, the second stop layer, the first sacrificial layer, the first stop layer, and the semiconductor substrate can be etched to form a groove. An insulating dielectric material can be filled in the groove to form an isolation structure. A top surface of the isolation structure can beg leveled with a surface of the second sacrificial layer. The second sacrificial layer can be removed, to expose sidewalls and a top of an exposed portion of the isolation structure. The second stop layer can be removed, and the exposed portion of the isolation structure can be etched to reduce a width of the top of the exposed portion of the isolation structure. The first sacrificial layer can be removed. A floating gate can be formed on the first stop layer.

Another aspect of the present disclosure includes a semiconductor structure. The structure includes a semiconductor substrate, a first stop layer disposed on the semiconductor substrate, a floating gate disposed on the first stop layer, and an isolation structure passing through the floating gate, the first stop layer and a portion of the semiconductor substrate. The isolation structure can be formed by performing a process. The process can include sequentially forming a first sacrificial layer on the first stop layer, a second stop layer on the first sacrificial layer, and a second sacrificial layer on the second stop layer. Next, the process can include etching the second sacrificial layer, the second stop layer, the first sacrificial layer, the first stop layer, and the semiconductor substrate, to form a groove. The process can further include filling an insulating dielectric material in the groove to form the isolation structure. The floating gate can be formed by performing a process. The process can include removing the second sacrificial layer to expose sidewalls and a top of an exposed portion of the isolation structure. Next, the process can include removing the second stop layer and etching the exposed portion of the isolation structure, to reduce a width of the top of the exposed portion of the isolation structure. The process can further include removing the first sacrificial layer and forming the floating gate on the first stop layer.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

In a conventional process of forming a floating gate structure, spacing between adjacent isolation structures is often small. Thus, during a process of filling polysilicon between the adjacent isolation structures to form a polysilicon layer, voids can be easily formed in the polysilicon layer and can affect quality of the formed floating gate.

In order to prevent voids within the polysilicon layer, the spacing between the adjacent isolation structures may need to be increased. Providing that the size of a semiconductor substrate is fixed, width of the isolation structure needs to be reduced accordingly. That is, the size of the groove formed by etching the semiconductor substrate needs to be reduced. However, during a process of depositing silicon oxide in the groove to form the isolation structure, voids (i.e., holes) can correspondingly form in the silicon oxide. Isolation effect of the isolation structure can thus be reduced.

Various embodiments provide a method for forming a semiconductor structure. Without changing the size of the isolation structure, quality of deposited polysilicon can be improved. Thus, the formed floating gate structure can be improved accordingly.

Figure 14:
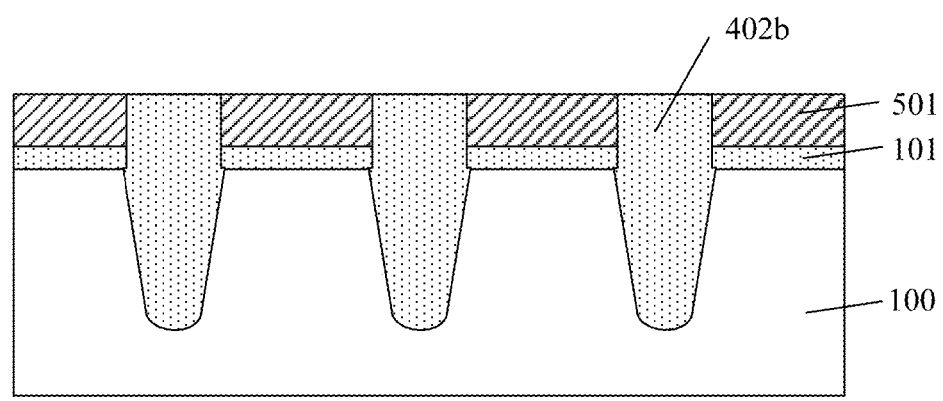
Figure 15:
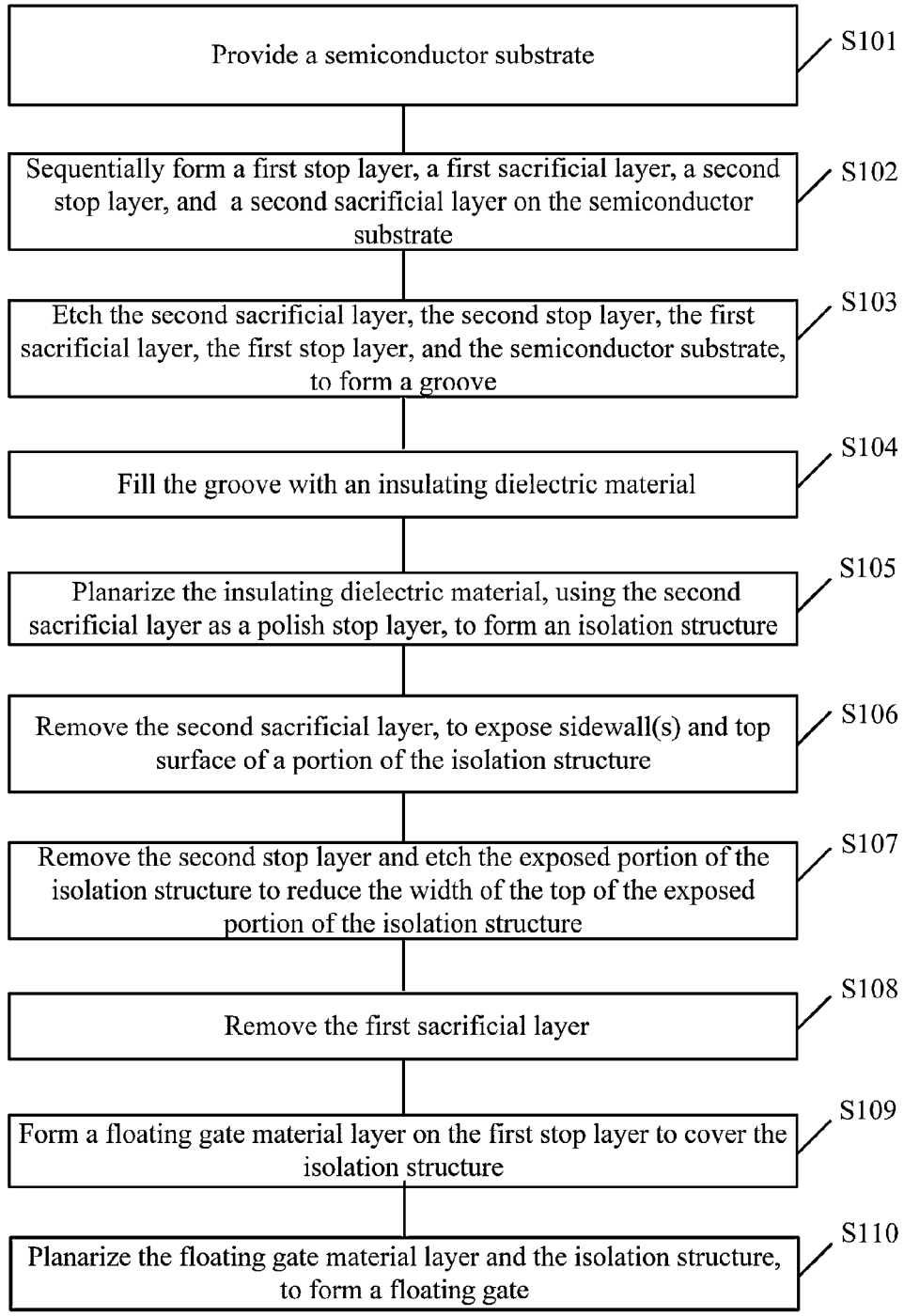
FIG. 15 depicts a flow diagram of an exemplary method for forming a semiconductor structure in accordance with various disclosed embodiments.

FIG. 15 depicts a flow diagram of an exemplary method for forming a semiconductor structure in accordance with various disclosed embodiments. FIGS. 5-14 depict cross-sectional views of the semiconductor structure at various stages during its formation in accordance with various disclosed embodiments. Note that although FIGS. 5-14 depict structures corresponding to the method depicted in FIG. 15, the structures and the method are not limited to one another in any manner.

Figure 1:
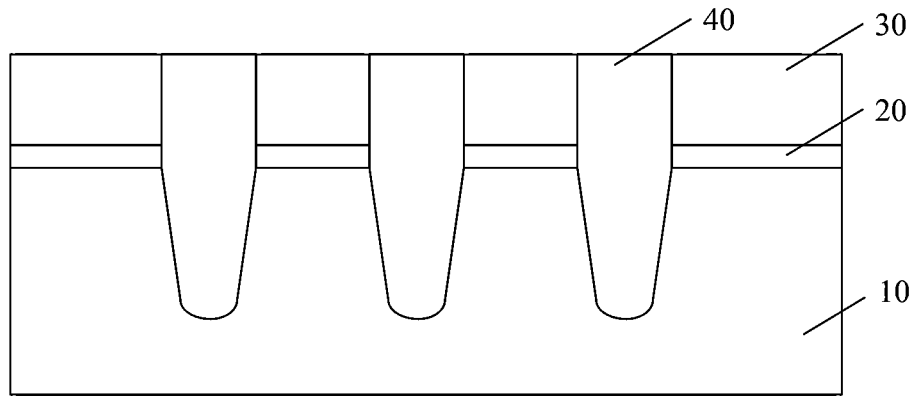
FIGS. 1-4 depict cross-sectional views of a floating gate structure of a conventional flash memory device.
Figure 2:
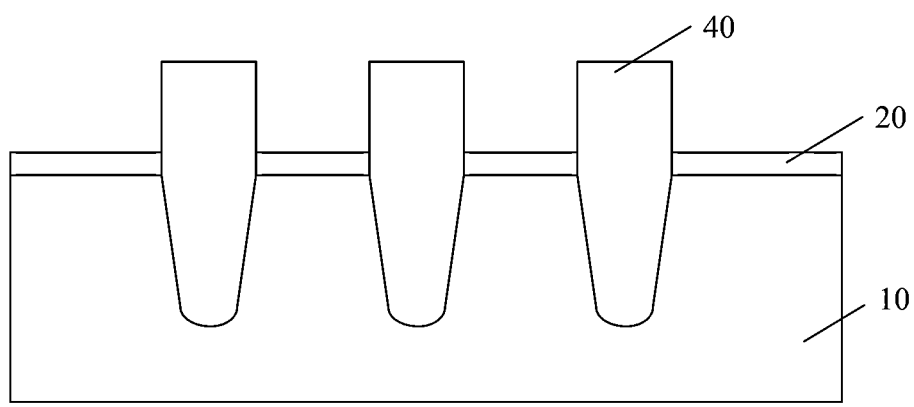
Figure 3:
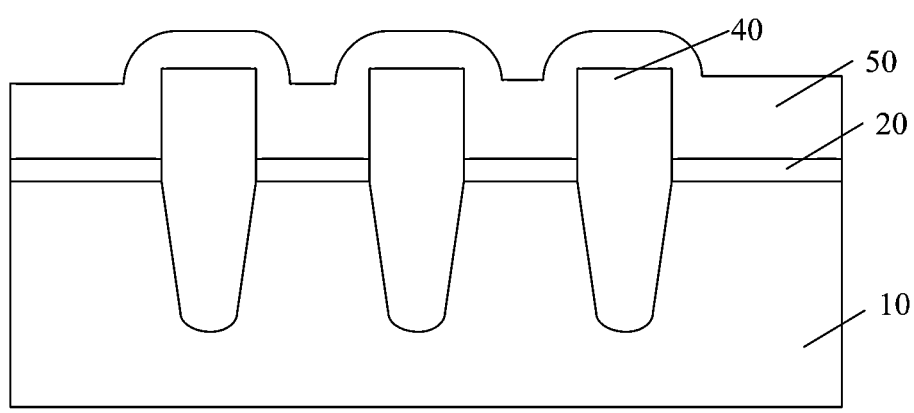
Figure 4:
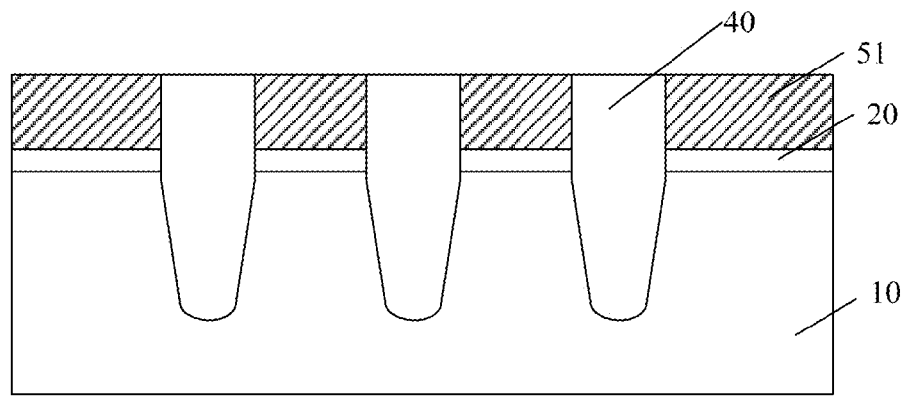
Figure 5:
FIGS. 5-14 depict cross-sectional views of an exemplary semiconductor structure at various stages during its formation in accordance with various disclosed embodiments.

In Step S101 of FIG. 15 and referring to FIG. 5, a semiconductor substrate 100 is provided. The semiconductor substrate 100 can be made of a material including a semiconductor material, e.g., silicon, germanium, silicon germanium, gallium arsenide, etc.

The semiconductor substrate 100 can be made of a bulk material, and/or a composite structure including, e.g., a silicon-on-insulator. The type of the semiconductor substrate 100 can be selected according to a semiconductor device formed on the semiconductor substrate 100. The type of the semiconductor substrate 100 does not limit the scope of the present disclosure.

Figure 6:
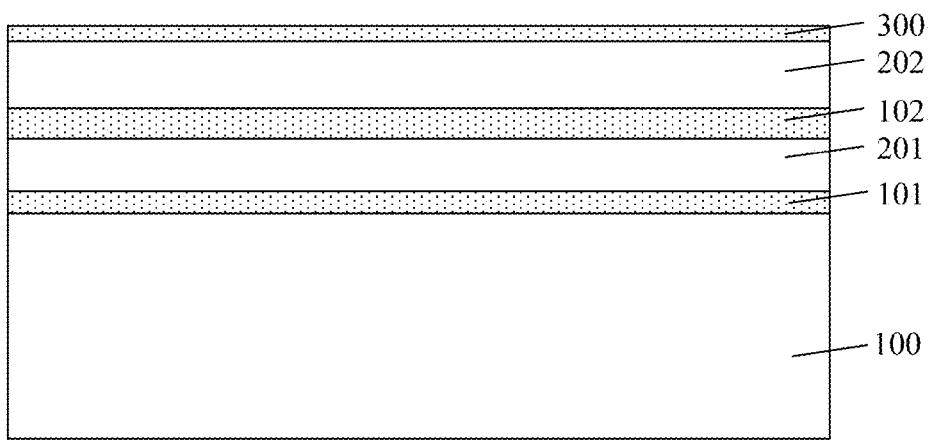

In Step S102 of FIG. 15 and referring to FIG. 6, sequentially, a first stop layer 101 is formed on a surface of the semiconductor substrate 100, a first sacrificial layer 201 is formed on a surface of the first stop layer 101, a second stop layer 102 is formed on a surface of the first sacrificial layer 201, and a second sacrificial layer 202 is formed on a surface of the second stop layer 102. Any suitable methods can be used for forming the first stop layer 101, the first sacrificial layer 201, the second stop layer 102, and the second sacrificial layer 202.

The first sacrificial layer 201 and the first stop layer 101 can be made of different materials. The second stop layer 102 and the second sacrificial layer 202 can be made of different materials.

In one embodiment, the first stop layer 101 can be made of a material including silicon oxide. The first sacrificial layer 201 can be made of a material including silicon nitride. The second stop layer 102 can be made of a material including silicon oxide. The second sacrificial layer 202 can be made of a material including silicon nitride.

The first stop layer 101 can have a thickness ranging from about 30 Å to about 200 Å. The first sacrificial layer 201 can have a thickness ranging from about 200 Å to about 1000 Å.

The second stop layer 102 can have a thickness ranging from about 30 Å to about 100 Å. The second sacrificial layer 202 can have a thickness ranging from about 200 Å to about 600 Å.

The first stop layer 101 can serve as a stop layer (e.g., an etch stop layer) when the first sacrificial layer 201 is subsequently removed. In addition, a portion of the first stop layer 101 can subsequently serve as a floating gate dielectric layer (i.e., a dielectric layer of a floating gate). The thickness of a subsequently-formed floating gate structure can be adjusted by adjusting the thickness of the first sacrificial layer 201. The thickness of the subsequently-formed floating gate structure can be equal to the thickness of the first sacrificial layer 201. The second stop layer 102 can serve as a stop layer when the second sacrificial layer 202 is subsequently removed.

In various embodiments, optionally, a surface-covering layer 300 can be formed on a surface of the second sacrificial layer 202. The surface-covering layer 300 can be used for protecting the second sacrificial layer 202. In one embodiment, the surface-covering layer 300 and the second sacrificial layer 202 can be made of different materials. For example, the surface-covering layer 300 can be made of a material layer including silicon oxide. The surface-covering layer 300 can have a thickness ranging from about 30 Å to about 100 Å.

Figure 7:
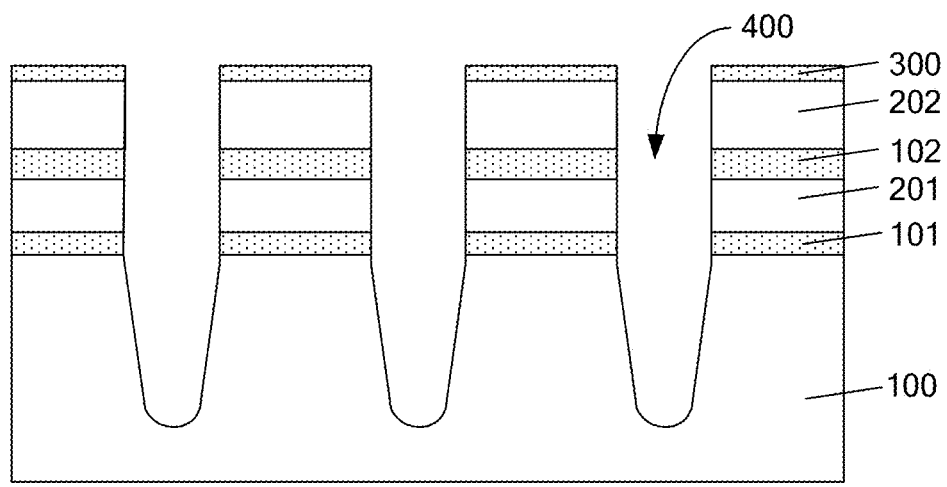

In Step S103 of FIG. 15 and referring to FIG. 7, the surface-covering layer 300, the second sacrificial layer 202, the second stop layer 102, the first sacrificial layer 201, the first stop layer 101, and the semiconductor substrate 100 are etched, to form a groove 400. Optionally, a certain thickness portion of the semiconductor substrate 100 can be etched. The certain thickness portion can have any suitable thickness depending on needs of the fabrication process.

For example, a method for forming the groove 400 can include the following steps. A patterned photoresist layer can be formed on a surface of the surface-covering layer 300. A pattern of the patterned photoresist layer can define a position and size of the subsequently-formed groove 400. The surface-covering layer 300 can be etched using the patterned photoresist layer as an etch mask, to transfer the pattern onto the surface-covering layer 300. Next, using the patterned photoresist layer and the surface-covering layer 300 as an etch mask, the second sacrificial layer 202, the second stop layer 102, the first sacrificial layer 201, the first stop layer 101, and the semiconductor substrate 100 can be etched to form the groove 400. The etching process can include, e.g., a dry etching process.

The surface-covering layer 300 can be used for protecting the second sacrificial layer 202 during the etching process, in order to prevent morphology of sidewalls of the second sacrificial layer 202 from being changed during the etching process. The second sacrificial layer 202 can have a relatively great thickness. Therefore, if the morphology of the second sacrificial layer 202 is changed, size and morphology of the subsequently-formed groove 400 may be caused to change accordingly, which can cause size of the subsequently-formed floating gate to be also changed. Therefore, the surface-covering layer 300 may improve accuracy of the size of the groove 400 and accuracy of the size and the morphology of the subsequently-formed floating gate.

The sidewall(s) of the groove 400 can be perpendicular to the semiconductor substrate 100. Alternatively, the sidewall(s) of the groove 400 can have a tilting angle (e.g., relative to the semiconductor substrate 100) ranging from about 84° to about 88°.

A width of the groove 400 can be similar or equal to a width of an isolation structure formed in any suitable floating gate structure (e.g., a conventional floating gate structure). Thus, a subsequently-formed isolation structure can be prevented from having voids caused by reducing the size of the groove 400, and can be prevented from affecting isolation effect of the isolation structure.

Figure 8:
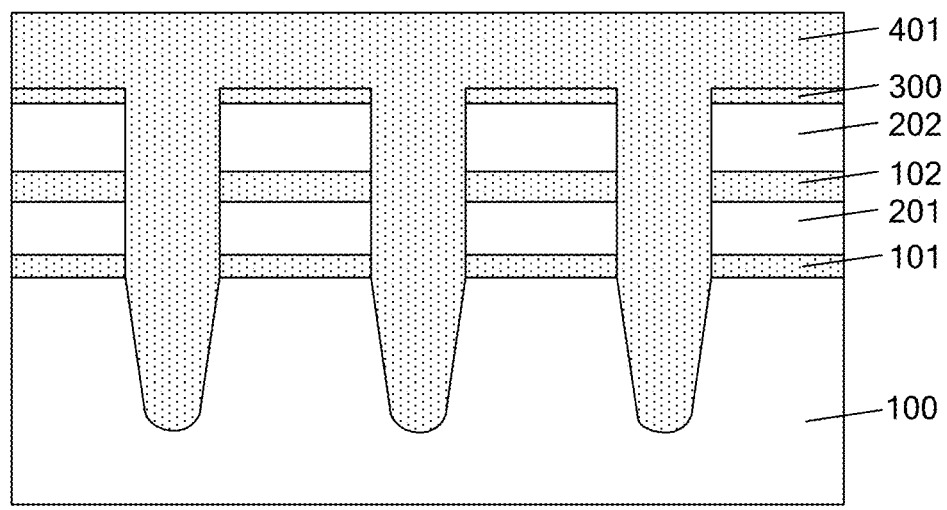

In Step S104 of FIG. 15 and referring to FIG. 8, the groove 400 (referring to FIG. 7) is filled with an insulating dielectric material 401. The insulating dielectric material 401 can fill the groove 400 (referring to FIG. 7) and cover the surface of the surface-covering layer 300.

The insulating dielectric material 401 can be made of a material including silicon oxide. In one embodiment, the insulating dielectric material 401 can be formed by using a chemical vapor deposition process. Because the width of the groove 400 can be similar or equal to the width of an isolation structure formed in any suitable floating gate structure, during the process of filling the groove 400 using a chemical vapor deposition process, there are no voids formed in the insulating dielectric material 401. The formed isolation structure can thus have desired quality.

Figure 9:
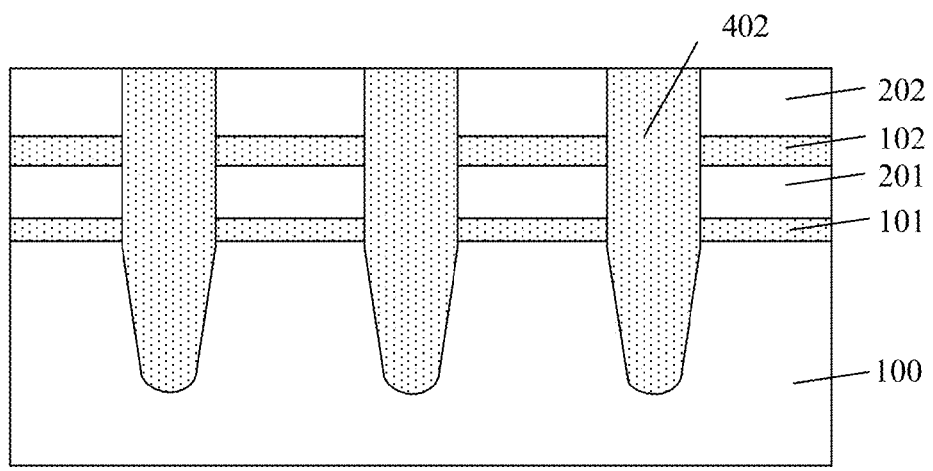

In Step S105 of FIG. 15 and referring to FIG. 9, the insulating dielectric material 401 is planarized, using the second sacrificial layer 202 as a polish stop layer. The surface-covering layer 300 (referring to FIG. 8) and the portion of the insulating dielectric material 401 located above the second sacrificial layer 202 can be removed, to form an isolation structure 402. A surface (i.e., a top surface) of the isolation structure 402 can be leveled with the surface of the second sacrificial layer 202.

On one hand, the surface-covering layer 300 can protect the sacrificial layer 202 during the etching of the groove 400. On the other hand, the surface-covering layer 300 (and/or the second sacrificial layer 202) can serve as the polish stop layer during a chemical mechanical polishing process, such that the top surface of the formed isolation structure 402 can be leveled with the surface of the second sacrificial layer 202.

Figure 10:
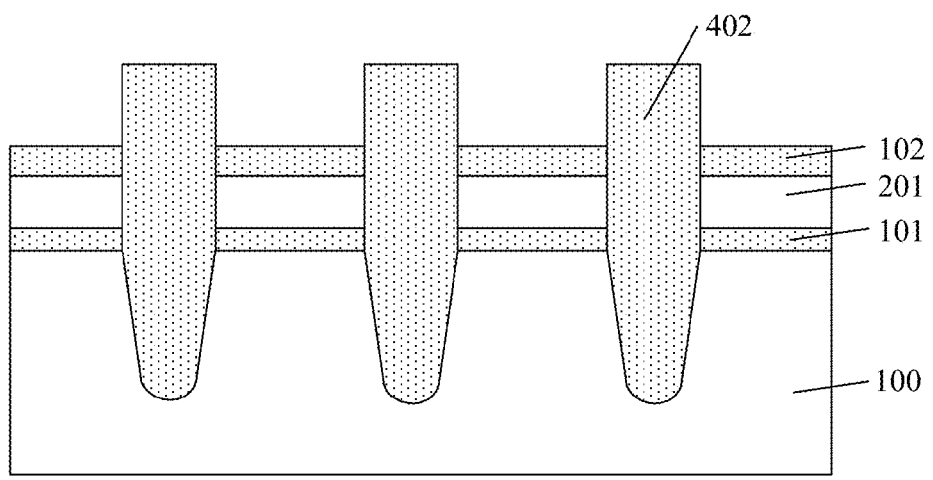

In Step S106 of FIG. 15 and referring to FIG. 10, the second sacrificial layer 202 (referring to FIG. 9) is removed, to expose sidewall(s) and top surface (i.e., top) of a portion of the isolation structure 402. The portion of the isolation structure 402 having sidewall(s) and top surface exposed can thus be referred to as an exposed portion of the isolation structure 402.

In various embodiments, the second sacrificial layer 202 (referring to FIG. 9) can be removed using a wet etching process. An etching solution used in the wet etching process can have a relatively high selectivity (or selection ratio) for the second sacrificial layer 202.

For example, in some embodiments, the etching solution used in the wet etching process can include a phosphoric acid solution, and can have an etching temperature ranging from about 140° C. to about 200° C. Because the etching solution can have a relatively low etching rate for the second stop layer 102, the wet etching process can use the second stop layer 102 as an etch stop layer.

In other embodiments, during the removal of the second sacrificial layer 202 using the wet etching process, the etching solution can result in some loss of the top (e.g., the top surface) and the sidewall(s) of the isolation structure 402. The etching can thus result in an exposed portion of the isolation structure 402 that has tilted (i.e., inclined) sidewall(s) and an arc-shaped (or curve-shaped) top. Thus, the width of the top of the isolation structure 402 can be reduced.

Figure 11:
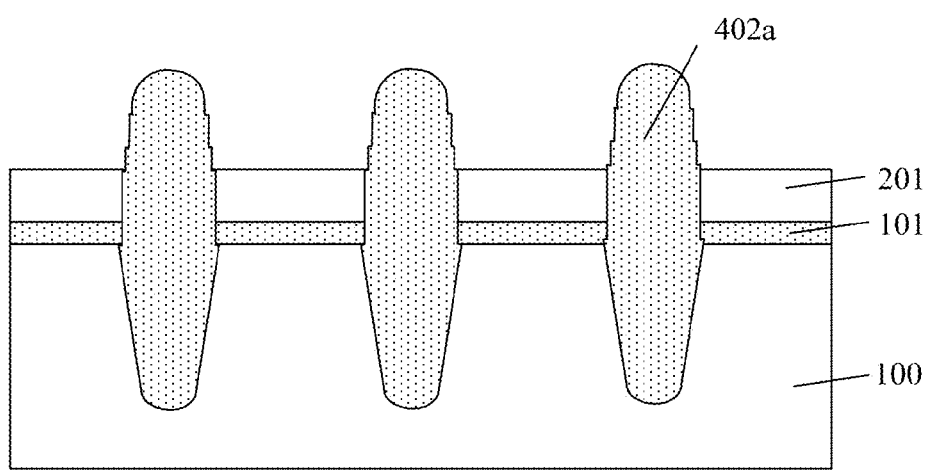

In Step S107 of FIG. 15 and referring to FIG. 11, the second stop layer 102 (referring to FIG. 10) is removed, and the exposed portion of the isolation structure 402 (referring to FIG. 10) is etched to reduce the width of the top of the exposed portion of the isolation structure 402. An isolation structure 402*a* having an arc-shaped top can thus be formed. The sidewalls of the isolation structure 402*a* may be inclined. For example, the sidewalls may be in a ladder-like or stepped shape, or may have a tilted surface. The inclining degree of the sidewalls may be controlled based on the reduced width of the top of the exposed portion of the isolation structure 402.

For example, the second stop layer 102 can be removed using a dry etching process. Because the second stop layer 102 and the isolation structure 402 can be made of the same material, at the same time of removing the second stop layer 102 by etching, the isolation structure 402 can be etched. In one embodiment, the second stop layer 102 and the isolation structure 402 can be made of a material including silicon oxide. In one embodiment, the dry etching process can use an etching gas including $CF_4$, a buffer gas including He, and can have a pressure ranging from about 20 mTorr to about 200 mTorr. The $CF_4$ can have a flow rate ranging from about 50 sccm to about 1000 sccm. The He can have a flow rate ranging from about 50 sccm to about 1000 sccm.

The second stop layer 102 can have a relatively small thickness. Therefore, in comparison with a wet etching process, the dry etching process can remove the second stop layer 102 and avoid significant etching of the isolation structure 402, and can thus avoid damaging the isolation structure 402.

At the same time of etching the second stop layer 102, exposed sidewalls and top surface of the isolation structure 402 (i.e., sidewalls and top surface of the exposed portion of the isolation structure 402) can be etched, such that the sidewalls of the portion of the isolation structure 402 that is above the first sacrificial layer 201 can have a stair shape (i.e., a ladder-like shape). In addition, from near the position of the first sacrificial layer 201 to the top of the isolation structure 402, the width of the portion of the isolation structure 402 that is above the first sacrificial layer 201 can gradually decrease.

After the second stop layer 102 is removed, the isolation structure 402 becomes an isolation structure 402*a*. The top (i.e., the top portion) of the isolation structure 402*a* can thus have an arc shape.

Thus, a width at a top of an opening between adjacent isolation structures 402*a* can be increased, which can ease subsequent deposition of a floating gate material (or a floating gate material layer) in the opening between the adjacent isolation structures 402*a*. Accordingly, deposition process window can be widened. In addition, the width of the opening can have the stair shape from the top to the bottom (i.e., near the position of the first sacrificial layer 201), i.e., the width of the opening can be changed in a stepwise manner.

Thus, difficulty of depositing the floating gate material can be reduced, and voids can be prevented from being formed in the floating gate material during the deposition process. Therefore, quality of subsequent-formed floating gate can be improved. In various embodiments, after the removing of the second stop layer 102, the portion of the isolation structure 402*a* located above the first sacrificial layer 201 can have inclined sidewalls, and can have a tapered or trapezoidal cross section in a direction vertical to the semiconductor substrate. The cross section can have a trapezoidal or semi-circle top portion.

Figure 12:
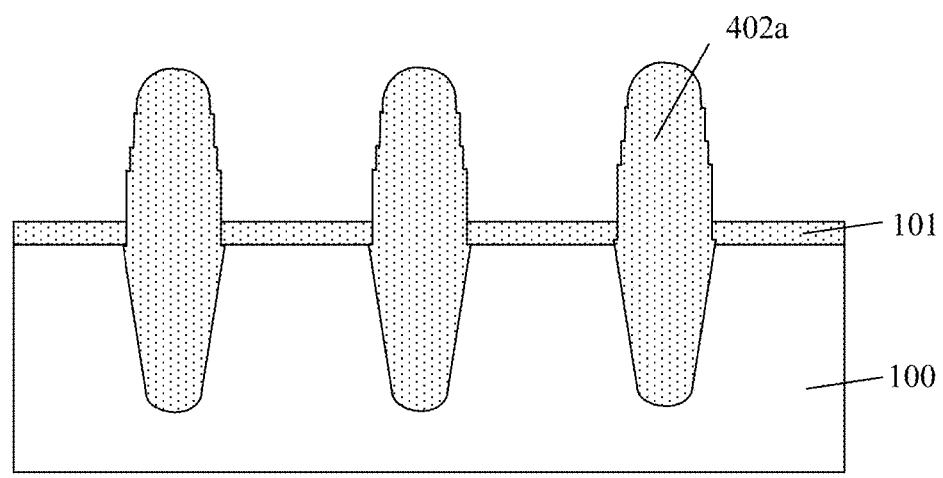

In Step S108 of FIG. 15 and referring to FIG. 12, the first sacrificial layer 201 (referring to FIG. 11) is removed. For example, the first sacrifice layer 201 can be removed using a wet etching process.

During the removal of the second stop layer 102 (referring to FIG. 10), the first sacrificial layer 201 can protect, and also keep a vertical shape and a desired morphology of, sidewalls of a portion of the isolation structure 402a. After the first sacrificial layer 201 (referring to FIG. 11) is removed, sidewall(s) of the portion of the isolation structure 402a that is originally located in the first sacrifice layer 201 can be exposed, and the sidewalls can be substantially vertical to the semiconductor substrate 100. Thus, sidewalls of a subsequently-formed floating gate can be substantially vertical to the semiconductor substrate 100 accordingly.

Further, when a wet etching process is used for removing the first sacrificial layer 201, damage to the sidewalls of the exposed portion of the isolation structure 402a can be relatively small, so the sidewalls of the portion of the isolation structure 402a that is originally located in the first sacrifice layer 201 can have desired morphology. Thus, morphology of the subsequently-formed floating gate can be improved. The thickness of the first sacrificial layer 201 can be equal to the height of the subsequently-formed floating gate.

Figure 13:
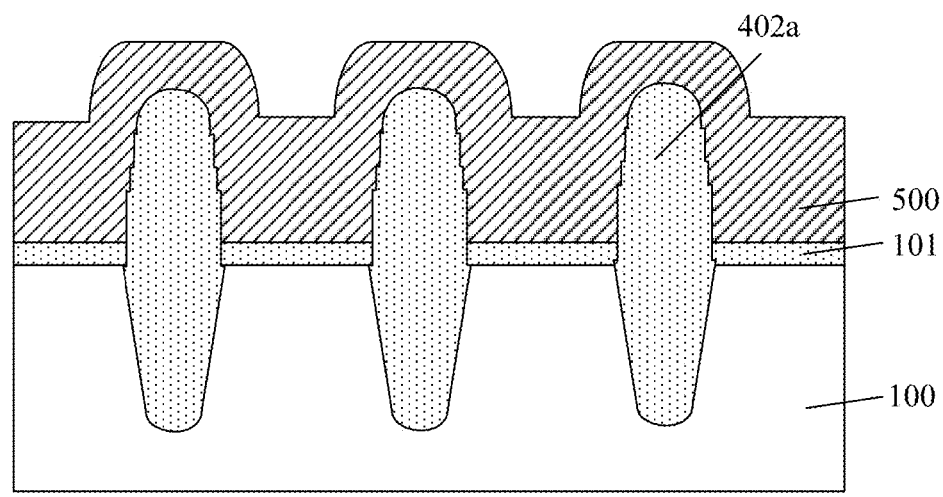

In Step S109 of FIG. 15 and referring to FIG. 13, a floating gate material layer 500 is formed on the surface of first stop layer 101 to cover the isolation structure 402a. For example, the floating gate material layer 500 can be made of a material including polysilicon. In one embodiment, the polysilicon can be formed using a chemical vapor deposition process. For example, the chemical vapor deposition process can use a reaction gas including $SiH_4$. The $SiH_4$ can have a flow rate ranging from about 200 sccm to about 2000 sccm. The chemical vapor deposition process can use an auxiliary gas including $N_2$. The $N_2$ can have a flow rate ranging from about 500 sccm to about 5000 sccm.

The isolation structure 402a can have the arc-shaped top, and have the stair-shaped inclined sidewalls. In addition, the width of the top of the isolation structure 402a can be smaller than the width of the isolation structure 402a in the first stop layer 101. Thus, the opening between adjacent isolation structures 402a can have a relatively great width at the top, and the width of the opening can be changed stepwise from top to bottom (i.e., from top to the position of the first stop layer 101). Therefore, process window of depositing the floating gate material (i.e., the floating gate material layer 500) can be widened (or enlarged). Difficulty of the deposition process can be reduced. Voids can be prevented from being formed in the floating gate material layer 500 during the deposition process. Quality of subsequent-formed floating gate can thus be improved.

In one embodiment, after the floating gate material layer 500 is formed, one or more ion implantation processes can be performed on the floating gate material layer 500, in order to reduce electrical resistance of the floating gate material layer 500.

In Step S110 of FIG. 15 and referring to FIG. 14, the floating gate material layer 500 and the isolation structure 402a (referring to FIG. 13) are planarized to form a floating gate 501, such that the thickness of the floating gate 501 can be substantially equal to the thickness of the first sacrificial layer 201 (referring to FIG. 11). After the floating gate 501 is formed, the isolation structure 402a becomes an isolation structure 402b.

In one embodiment, the floating gate material layer 500 and the isolation structure 402a can be planarized using a chemical mechanical polishing process. The surface of the floating gate 501 can thus be leveled with the surface of the isolation structure 402b. By controlling the time of the chemical mechanical polishing process, the thickness of the subsequently-formed (or finally-formed) floating gate 501 can be adjusted.

In one embodiment, the thickness of the floating gate 501 can be substantially equal to the thickness of the first sacrificial layer 201. The sidewalls of the portion of the isolation structure 402a that is originally located in the first sacrifice layer 201 (i.e., in the same height range or thickness range of the first sacrifice layer 201) are relatively smooth. Therefore, when the thickness of the floating gate 501 is equal to the thickness of the first sacrificial layer 201, sidewalls of the floating gate 501 can be smooth and have desired morphology accordingly. The thickness and the morphology of the floating gate 501 can be determined by the thickness and the morphology of the first sacrificial layer 201.

In certain embodiments, during the removal of the first sacrificial layer 201 using a wet etching process, there can be some loss of the sidewalls of the isolation structure 402a. Thus, the sidewalls of the portion of the isolation structure 402a that is originally located in the first sacrifice layer 201 (i.e., in the same height or thickness range of the first sacrifice layer 201) can be inclined (i.e., tilted) to a certain degree. Therefore, the width of the top of the subsequently-formed floating gate 501 can be greater than the width of the semiconductor substrate 100 between adjacent isolation structures 402b below the floating gate 501. As a result, coupling ratio of a flash memory device that is subsequently formed based on the floating gate 501 can be improved.

As disclosed in various embodiments, a first stop layer, a first sacrificial layer, a second stop layer, and a second sacrificial layer can be sequentially formed on the surface of a semiconductor substrate. The second sacrificial layer, the second stop layer, the first sacrificial layer, the first stop layer, and the semiconductor substrate can be etched, to form a groove. An isolation structure can be formed in the groove. The top surface of the isolation structure can be leveled with the surface of the second sacrificial layer. By removing the second sacrificial layer, sidewalls and top of a portion of the isolation structure can be exposed. At the same time of subsequently etching the second stop layer, sidewalls and top of the exposed portion of the isolation structure can be etched, such that the width of the top of the isolation structure can be reduced.

Therefore, without changing the size (or dimension) of the subsequently-formed (or finally-formed) isolation structure, the width of the top of an opening between adjacent isolation structures can be increased. Difficulty of subsequently filling floating gate material between adjacent isolation structures can be reduced. Voids can thus be prevented from being formed in the floating gate material. Therefore, quality of a subsequent-formed floating gate can be improved.

Moreover, after the second stop layer is removed, the first sacrificial layer can be removed, to further expose sidewalls of a portion of the isolation layer (i.e., the isolation structure). A floating gate material layer can then be formed on the surface of the first stop layer. The floating gate material layer and the isolation structure can be planarized, such that the thickness of the floating gate material layer can be equal to the thickness of the first sacrificial layer. Thus, by controlling thickness and morphology of the first sacrificial layer, thickness and morphology of the subsequently-formed (or finally-formed) floating gate can be controlled relatively easily.

Various embodiments also provide a semiconductor structure. For example, referring to FIG. 14, an exemplary structure can include a semiconductor substrate 100, a first stop layer 101 on the semiconductor substrate 100, a floating gate 501 on the first stop layer 101. The exemplary structure can further include an isolation structure 402b passing through the floating gate 501, the first stop layer 101 and a portion of the semiconductor substrate 100. The isolation structure 402b can be formed using the method for forming the semiconductor structure in accordance with various disclosed embodiments (e.g., as shown in FIGS. 5-9, FIG. 15). The floating gate 501 can be formed using the method for forming the semiconductor structure in accordance with various disclosed embodiments (e.g., as shown in FIGS. 10-14, FIG. 15).

For illustrative purposes, one exemplary method of forming a semiconductor structure can be as follows. A semiconductor substrate (e.g., a silicon wafer) can be provided. Sequentially, a first stop layer (e.g., a pad oxide layer, or a silicon oxide layer), a first sacrificial layer (e.g., a first silicon nitride layer), a second stop layer (e.g., a silicon oxide layer), and a second sacrificial layer (e.g., a second silicon nitride layer) can be disposed on the semiconductor substrate.

Next, the second sacrificial layer, the second stop layer, the first sacrificial layer, the first stop layer, and the semiconductor substrate can be etched to form a groove. An insulating dielectric material (e.g., silicon oxide, or shallow trench isolation oxide) can be filled in the groove. The insulating dielectric material can then be planarized by a chemical mechanical polishing process, using the second sacrificial layer as a polish stop layer. An isolation structure can thus be formed.

Further, the second sacrificial layer can be removed. The second stop layer can then be removed by an oxide dry etching process. Next, the first sacrificial layer can be removed. A floating gate material layer (e.g., polysilicon) can be deposited on the isolation structure and on the first stop layer. The floating gate material layer and the isolation structure can be planarized by a chemical mechanical polishing process to form a floating gate.

In one embodiment, the thickness of the floating gate can be determined by the thickness of the first sacrificial layer. The first sacrificial layer can have a thickness ranging from about 200 Å to about 1000 Å.

In one embodiment, the portion of the isolation structure above the first stop layer (or above the first sacrificial layer) can have sidewalls of a stair shape (i.e., a ladder-like shape) with a tapered profile (i.e. a tapered cross section in a direction perpendicular to the semiconductor substrate), and can have a rounded (i.e., arc-shaped) top. The sidewalls are thus not vertical to the semiconductor substrate, and the shape of the top is not sharp.

In one embodiment, there are no voids formed in the isolation structure or the floating gate. The floating gate can have a thickness ranging from about 200 Å to about 1000 Å.

In one embodiment, one or more ion implantation processes can be performed on the floating gate material layer after the first sacrificial layer is removed, or before the floating gate material layer is planarized by the chemical mechanical polishing process. In one embodiment, the portion of the groove (in the second sacrificial layer, the second stop layer, and the first sacrificial layer) can have sidewalls perpendicular to the semiconductor substrate, or have sidewalls at a tilting angle ranging from about 84° to about 88° relative to the semiconductor substrate.

In one embodiment, the formed floating gate can have a bowl-shaped cross section in a direction perpendicular to the semiconductor substrate. That is, the width of the top of the floating gate can be greater than the width of the semiconductor substrate between adjacent isolation structures below the floating gate.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor structure, comprising:
   providing a semiconductor substrate;
   forming a first stop layer on the semiconductor substrate, a first sacrificial layer on the first stop layer, a second stop layer on the first sacrificial layer, and a second sacrificial layer on the second stop layer;
   forming a surface-covering layer on the second sacrificial layer, wherein the surface-covering layer is made of a material layer including silicon oxide, and has a thickness ranging from about 30 Å to about 100 Å;
   etching the second sacrificial layer, the second stop layer, the first sacrificial layer, the first stop layer, and the semiconductor substrate, to form a groove;
   filling an insulating dielectric material in the groove to form an isolation structure, a top surface of the isolation structure being leveled with a surface of the second sacrificial layer;
   removing the second sacrificial layer, to expose sidewalls and a top of an exposed portion of the isolation structure;
   removing the second stop layer and etching the exposed portion of the isolation structure, to reduce a width of the top of the exposed portion of the isolation structure;
   removing the first sacrificial layer; and
   forming a floating gate on the first stop layer.

2. The method according to claim 1, wherein the first sacrificial layer and the first stop layer are made of a different material.

3. The method according to claim 2, wherein the second stop layer and the second sacrificial layer are made of a different material.

4. The method according to claim 3, wherein the second stop layer and the isolation structure are made of a same material.

5. The method according to claim 3, wherein:
   the first stop layer is made of a material including silicon oxide;
   the first sacrificial layer is made of a material including silicon nitride;
   the second stop layer is made of a material including silicon oxide; and
   the second sacrificial layer is made of a material including silicon nitride.

6. The method according to claim 5, wherein:
   the first stop layer has a thickness ranging from about 30 Å to about 200 Å;
   the first sacrificial layer has a thickness ranging from about 200 Å to about 1000 Å;
   the second stop layer has a thickness ranging from about 30 Å to about 100 Å; and
   the second sacrificial layer has a thickness ranging from about 200 Å to about 600 Å.

7. The method according to claim 3, wherein the second sacrificial layer is removed using a wet etching process.

8. The method according to claim 3, wherein the second stop layer is removed using a dry etching process, the dry etching process uses an etching gas including $CF_4$ and a buffer gas including He, and the dry etching process has a pressure ranging from about 20 mTorr to about 200 mTorr, and wherein:
the $CF_4$ has a flow rate ranging from about 50 sccm to about 1000 sccm; and
the He has a flow rate ranging from about 50 sccm to about 1000 sccm.

9. The method according to claim 8, wherein:
during the removing of the second stop layer, the exposed portion of the isolation structure is etched simultaneously; and
after the removing of the second stop layer, the exposed portion of the isolation structure has inclined sidewalls and a tapered or trapezoidal cross section in a direction vertical to the semiconductor substrate, the cross section has a trapezoidal or semi-circle top portion, and the isolation structure located in the first sacrificial layer has substantially vertical sidewalls.

10. The method according to claim 1, wherein the first sacrificial layer is removed using a wet etching process.

11. The method according to claim 1, wherein the filling of the insulating dielectric material in the groove to form the isolation structure includes:
filling the insulating dielectric material in the groove, the insulating dielectric material filling the groove and covering the surface-covering layer; and
planarizing the insulating dielectric material using the second sacrificial layer as a polish stop layer, to remove the surface-covering layer and a portion of the insulating dielectric material above the second sacrificial layer, to form the isolation structure, the top surface of the isolation structure being leveled with the surface of the second sacrificial layer.

12. The method according to claim 1, wherein the groove has sidewalls having a tilting angle relative to the semiconductor substrate ranging from about 84° to about 88°.

13. A method for forming a semiconductor structure, comprising:
providing a semiconductor substrate;
forming a first stop layer on the semiconductor substrate, a first sacrificial layer on the first stop layer, a second stop layer on the first sacrificial layer, and a second sacrificial layer on the second stop layer;
etching the second sacrificial layer, the second stop layer, the first sacrificial layer, the first stop layer, and the semiconductor substrate, to form a groove;
filling an insulating dielectric material in the groove to form an isolation structure, a top surface of the isolation structure being leveled with a surface of the second sacrificial layer;
removing the second sacrificial layer, to expose sidewalls and a top of an exposed portion of the isolation structure;
removing the second stop layer and etching the exposed portion of the isolation structure, to reduce a width of the top of the exposed portion of the isolation structure;
removing the first sacrificial layer; and
forming a floating gate on the first stop layer by:
forming a floating gate material layer on the first stop layer to cover the isolation structure; and
planarizing the floating gate material layer and the isolation structure to form the floating gate, wherein the floating gate has a surface leveled with a surface of the isolation structure.

14. The method according to claim 13, wherein:
the first sacrificial layer and the first stop layer are made of a different material,
the second stop layer and the second sacrificial layer are made of a different material, and
the second stop layer and the isolation structure are made of a same material.

15. The method according to claim 13, wherein:
the first stop layer is made of a material including silicon oxide;
the first sacrificial layer is made of a material including silicon nitride;
the second stop layer is made of a material including silicon oxide; and
the second sacrificial layer is made of a material including silicon nitride.

16. The method according to claim 13, wherein:
the first stop layer has a thickness ranging from about 30 Å to about 200 Å;
the first sacrificial layer has a thickness ranging from about 200 Å to about 1000 Å;
the second stop layer has a thickness ranging from about 30 Å to about 100 Å; and
the second sacrificial layer has a thickness ranging from about 200 Å to about 600 Å.

17. The method according to claim 13, wherein the floating gate has a thickness substantially equal to a thickness of the first sacrificial layer, and sidewalls of the floating gate are substantially vertical to the semiconductor substrate.

18. The method according to claim 13, wherein the floating gate has a width greater than a width of the semiconductor substrate below the floating gate and between the isolation structure and an adjacent isolation structure.

19. A semiconductor structure, comprising:
a semiconductor substrate;
a first stop layer disposed on the semiconductor substrate;
floating gate disposed on the first stop layer; and
an isolation structure passing through the floating gate, the first stop layer and a portion of the semiconductor substrate, wherein:
the isolation structure is formed by performing a process including:
sequentially forming a first sacrificial layer on the first stop layer, a second stop layer on the first sacrificial layer, and a second sacrificial layer on the second stop layer;
etching the second sacrificial layer, the second stop layer, the first sacrificial layer, the first stop layer, and the semiconductor substrate, to form a groove; and
filling an insulating dielectric material in the groove to form the isolation structure;
and the floating gate is formed by performing a process including:
removing the second sacrificial layer, to expose sidewalls and a top of an exposed portion of the isolation structure;
removing the second stop layer and etching the exposed portion of the isolation structure, to reduce a width of the top of the exposed portion of the isolation structure;
removing the first sacrificial layer; and
forming the floating gate on the first stop layer by:
forming a floating gate material layer on the first stop layer to cover the isolation structure; and planarizing the floating gate material layer and the isolation structure to form the floating gate, such that the floating gate has a thickness substantially equal to a thickness of the first sacrificial layer, sidewalls of the floating gate are substantially vertical to the semiconductor substrate, and the floating gate and the isolation structure have substantially no voids.

20. The structure according to claim 19, wherein:

during the removing of the second stop layer, the exposed portion of the isolation structure is etched simultaneously; and after the removing of the second stop layer, the exposed portion of the isolation structure has inclined sidewalls and a tapered or trapezoidal cross section in a direction vertical to the semiconductor substrate, the cross section has a trapezoidal or semi-circle top portion, and the isolation structure located in the first sacrificial layer has substantially vertical sidewalls.

* * * * *